(12) United States Patent
Secker et al.

(10) Patent No.: US 9,608,754 B2
(45) Date of Patent: *Mar. 28, 2017

(54) SYSTEMS AND METHODS FOR SYNCHRONIZATION OF CLOCK SIGNALS

(71) Applicant: Aviat U.S., Inc., Santa Clara, CA (US)

(72) Inventors: Philip Secker, Upper Hutt (NZ); Emerick Vann, Dublin, CA (US)

(73) Assignee: Aviat U.S., Inc., Milpitas, CA (US)

( * ) Notice: Subject to any disclaimer, the term of this patent is extended or adjusted under 35 U.S.C. 154(b) by 129 days.

This patent is subject to a terminal disclaimer.

(21) Appl. No.: 14/639,896

(22) Filed: Mar. 5, 2015

(65) Prior Publication Data

US 2015/0180600 A1    Jun. 25, 2015

Related U.S. Application Data

(63) Continuation of application No. 13/625,761, filed on Sep. 24, 2012, now Pat. No. 9,014,215.

(Continued)

(51) Int. Cl.
*H04J 3/06* (2006.01)
*H04L 7/00* (2006.01)
(Continued)

(52) U.S. Cl.
CPC .......... *H04J 3/0691* (2013.01); *H03L 7/0805* (2013.01); *H03L 7/0807* (2013.01);
(Continued)

(58) Field of Classification Search
CPC .......... H04J 3/0691; H04J 3/12; H04J 3/0638; H04J 3/0647; H04L 7/0008; H04L 7/0337; H03L 7/0805; H03L 7/0807
See application file for complete search history.

(56) References Cited

U.S. PATENT DOCUMENTS 5,638,010 A * 6/1997 Adams ................ G06F 1/025
                                                    327/105
5,812,523 A 9/1998 Isaksson et al.
(Continued)

FOREIGN PATENT DOCUMENTS

WO    2006029511    3/2006
WO    2011022735    2/2011

OTHER PUBLICATIONS

European Patent Application No. 12833217.8, Search Report mailed Mar. 30, 2015.
(Continued)

*Primary Examiner* — Kevin Mew
(74) *Attorney, Agent, or Firm* — Sheppard, Mullin, Richter & Hampton LLP

(57) ABSTRACT

A system may include a transmitting device. The transmitting device may include one or more terminals for receiving a data signal and a first clock signal. A first phase lock loop may lock a phase of an initial periodic signal with a phase of the first clock signal, the first phase lock loop including a divider to generate the initial periodic signal based on the first clock signal. A decimation module may sample the initial periodic signal at a decimated rate of a backplane clock, the backplane clock being asynchronous with a clock that generated the first clock signal. A transmitting data block interface may construct data blocks and provide the data blocks to a receiving device, each of one or more of the data blocks including a portion of the data signal and at least one sample of the initial periodic signal.

20 Claims, 9 Drawing Sheets

Related U.S. Application Data

(60) Provisional application No. 61/538,089, filed on Sep. 22, 2011.

(51) Int. Cl.
  *H03L 7/08* (2006.01)
  *H04L 7/033* (2006.01)
  *H04J 3/12* (2006.01)

(52) U.S. Cl.
  CPC .......... *H04J 3/0638* (2013.01); *H04J 3/0647* (2013.01); *H04L 7/0008* (2013.01); *H04L 7/0337* (2013.01); *H04J 3/12* (2013.01)

(56) References Cited

U.S. PATENT DOCUMENTS

| | | | |
|---|---|---|---|
| 5,940,137 A | 8/1999 | Hulvey | |
| 6,259,727 B1* | 7/2001 | Auer | H03L 7/0994 375/222 |
| 6,353,604 B2 | 3/2002 | Grimwood et al. | |
| 6,782,007 B1 | 8/2004 | Redman | |
| 7,103,072 B1 | 9/2006 | Sloan et al. | |
| 7,821,958 B2 | 10/2010 | Smith et al. | |
| 7,966,510 B2 | 6/2011 | Harrison et al. | |
| 9,036,764 B1* | 5/2015 | Hossain | H03L 7/087 375/355 |
| 9,077,349 B2* | 7/2015 | Kong | H03L 7/07 |
| 2001/0033188 A1 | 10/2001 | Aung et al. | |
| 2002/0015423 A1 | 2/2002 | Rakib et al. | |
| 2002/0070811 A1* | 6/2002 | Skierszkan | H03L 7/07 331/1 A |
| 2003/0056136 A1 | 3/2003 | Aweya et al. | |
| 2004/0032922 A1* | 2/2004 | Knapp | H04J 3/0647 375/356 |
| 2004/0199567 A1 | 10/2004 | Lund | |
| 2005/0207480 A1* | 9/2005 | Norsworthy | H03H 17/0614 375/219 |
| 2006/0056560 A1 | 3/2006 | Aweya et al. | |
| 2006/0146884 A1 | 7/2006 | Skerritt | |
| 2006/0221936 A1 | 10/2006 | Rauchwerk | |
| 2007/0097947 A1 | 5/2007 | Aweya et al. | |
| 2008/0068056 A1* | 3/2008 | Poulton | H03L 7/0812 327/156 |
| 2009/0016382 A1 | 1/2009 | Beaucage | |
| 2009/0201093 A1* | 8/2009 | Wang | H03L 7/087 331/16 |
| 2009/0323669 A1 | 12/2009 | Salonidis et al. | |
| 2010/0091921 A1 | 4/2010 | Den Besten et al. | |
| 2010/0098433 A1 | 4/2010 | Boyd et al. | |
| 2010/0117706 A1 | 5/2010 | Stojanovic et al. | |
| 2010/0118894 A1 | 5/2010 | Aweya et al. | |
| 2010/0177615 A1* | 7/2010 | Yamamoto | G11B 20/10009 369/59.22 |
| 2011/0063034 A1* | 3/2011 | Moses | H03G 3/001 330/278 |
| 2011/0068867 A1* | 3/2011 | Moses | H03G 1/0088 330/131 |
| 2011/0080985 A1 | 4/2011 | Secker et al. | |
| 2012/0306538 A1* | 12/2012 | Aryanfar | H03L 7/0816 327/5 |
| 2013/0315349 A1* | 11/2013 | Nguyen | H04L 7/0016 375/340 |
| 2014/0086375 A1 | 3/2014 | Secker et al. | |

OTHER PUBLICATIONS

International Application No. PCT/US2012/056948, International Search Report and Written Opinion mailed Dec. 24, 2012.

* cited by examiner

SYSTEMS AND METHODS FOR SYNCHRONIZATION OF CLOCK SIGNALS

CLAIM OF PRIORITY

The present application is a continuation of and claims the benefit of U.S. Nonprovisional patent application Ser. No. 13/625,761, filed Sep. 24, 2012, entitled "Systems and Methods for Synchronization of Clock Signals," which claims priority to U.S. Provisional Patent Application Ser. No. 61/538,089, filed Sep. 22, 2011 and entitled "Synchronous Tone Signaling," which are incorporated by reference herein.

BACKGROUND

1. Field of the Invention(s)

The present invention(s) generally relate to processing of data on a transceiver. More particularly, the invention(s) relate to systems and methods for synchronization of clock signals across a backplane of a transceiver.

2. Description of Related Art

In microwave radio systems, a transceiver may include an indoor unit (IDU) and an outdoor unit (ODU) coupled to an antenna. In one example, the IDU may be coupled to a server or other computer over a wired network (e.g., LAN, WAN, or the Internet) or to a mobile network base-station. Information to be wirelessly transmitted may be prepared by both the IDU and the ODU before wireless transmission. Similarly, the outdoor unit may receive signals from the antenna to provide to the server, other computer, or mobile network node via the IDU.

Unlike time-division multiplexing networks, standard Ethernet does not carry clock synchronization information. New standards, such as G8262/Y.1362 from the ITU-T, require a significantly greater precision and accuracy than previous standards. As a result, accurate synchronization of a customer's clock signal across a backplane of a transceiver unit is an increasing challenge. For example, traversing an asynchronous TDM backplane from a digital access card (DAC) to a radio access card (RAC) can cause clock signals to lose precision. Stuffing bits in a nonperiodic, low frequency manner typically adds jitter and/or wander to the clock signal as it traverses a microwave network. The egress clock signal may be used to synchronize a base-station which in turn is used to synchronize mobile devices.

SUMMARY OF THE INVENTION

A system may include a transmitting device. The transmitting device may include one or more terminals for receiving a data signal and a first clock signal. A first phase lock loop may lock a phase of an initial periodic signal with a phase of the first clock signal, the first phase lock loop including a divider to generate the initial periodic signal based on the first clock signal. A decimation module may sample the initial periodic signal at a decimated rate of a backplane clock, the backplane clock being asynchronous with a clock that generated the first clock signal. A transmitting data block interface may construct data blocks and provide the data blocks to a receiving device, each of one or more of the data blocks including a portion of the data signal and at least one sample of the initial periodic signal.

In some embodiments, the transmitting data block interface is further configured to construct the data blocks to include data from the one or more terminals.

The receiving device may include: a receiving data block interface configured to receive the data blocks; a second phase lock loop configured to lock a phase of the at least one sample of the initial periodic signal with a phase of a second clock signal to produce a phase locked signal; a clock signal generator configured to recreate the first clock signal as a recreated clock based at least in part on the phase locked signal.

In some embodiments, the receiving device includes a timing module coupled to the clock signal generator, the timing module being configured to provide the recreated clock signal to one or more of an Outdoor Unit ("ODU") and customer equipment coupled to the receiving device. The receiving data block interface may operate based on a first backplane data clock. In various embodiments, the receiving data block interface operates based on a second clock signal that is not the first backplane clock signal.

In some embodiments, the second phase lock loop further comprises a second decimation module configured to generate a subset of samples of the recreated periodic signal to provide feedback and assist in locking the phase of the recreated periodic signal with the phase of the at least one sample of the initial periodic signal.

The transmitting data block interface may include a Time Division Multiplexing ("TDM") interface. The data blocks may comprise a plurality of TDM frames. The transmitting data block interface may incorporate a plurality of bits based on the sample of the initial periodic signal in each TDM frame.

A method may comprise: receiving a data signal; receiving a first clock signal; generating an initial periodic signal based on the first clock signal; locking a phase of the initial periodic signal with a phase of the first clock signal; sampling the initial periodic signal at a decimated rate of a backplane clock, the backplane clock being asynchronous with a clock that generated the first clock signal; and constructing data blocks, each of one or more of the data blocks including a portion of the data signal and at least one sample of the initial periodic signal; providing the data blocks to a receiving device.

The method may comprise constructing the data blocks to include data from the one or more terminals. The method may further comprise: receiving the data blocks; locking a phase of the at least one sample of the initial periodic signal with a phase of a second clock signal to produce a phase locked signal; and recreating the first clock signal as a recreated clock based at least in part on the phase locked signal.

In various embodiments, the method may comprise providing the recreated clock signal to one or more of an Outdoor Unit ("ODU") and customer equipment coupled to the receiving device. Constructing the data blocks may comprise Time Division Multiplexing ("TDM") the data blocks. The data blocks may comprise a plurality of TDM frames. Reconstructing the data blocks may comprise incorporating a plurality of bits based on the sample of the initial periodic signal in each TDM frame.

A system may comprise: means for receiving a data signal and for receiving a first clock signal; means for generating an initial periodic signal based on the first clock signal and for locking a phase of the initial periodic signal with a phase of the first clock signal; means for sampling the initial periodic signal at a decimated rate of a backplane clock, the backplane clock being asynchronous with a clock that generated the first clock signal; and means for constructing data blocks, each of one or more of the data blocks including a portion of the data signal and at least one sample of the initial periodic signal, and for providing the data blocks to a receiving device.

The means for constructing data blocks may be further configured to construct the data blocks to include data from the one or more terminals. The means for constructing data blocks may comprise a Time Division Multiplexing ("TDM") interface.

DETAILED DESCRIPTION OF THE INVENTION

Various embodiments described herein enable synchronization timing of an asynchronous clock signal across a backplane (in some examples referred to as a TDM backplane) that allows passage of synchronous signals derived from E1, T1, or Synchronous Ethernet clock signals to minimize wander effects that would typically cause failure in meeting G8262 specifications.

Figure 1:
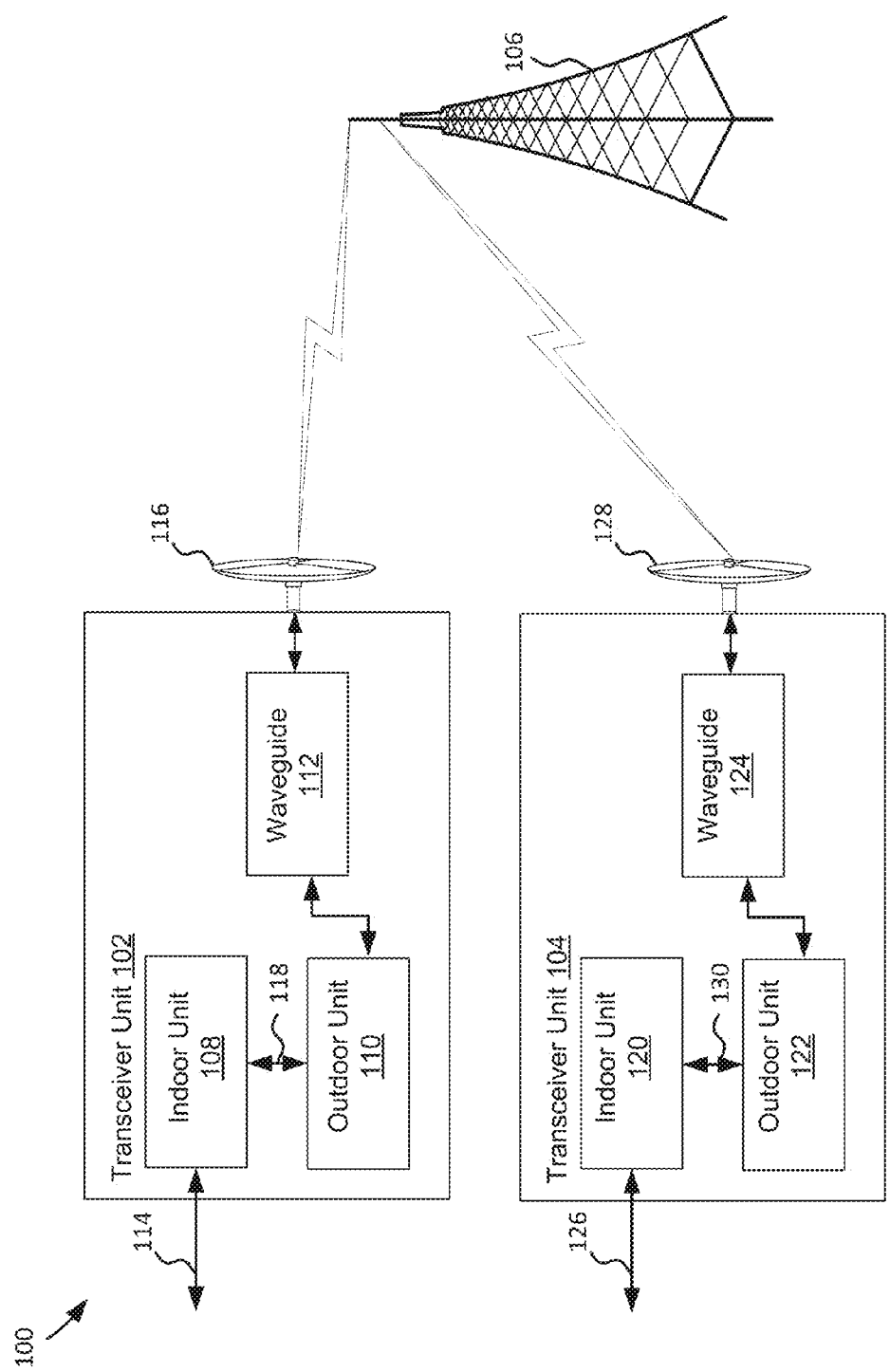
FIG. 1 is an environment including two transceiver units in some embodiments.

FIG. 1 is an environment 100 including two transceiver units 102 and 104 in some embodiments. Each of the transceiver units 102 and 104 are split mount radios. A split-mount radio has a part of the electronics mounted outdoors with an antenna and part indoors. The outdoor unit (ODU) may be the RF transmitter/receiver. In various embodiments, the indoor unit (INU) contains a data access card (DAC) and a radio access card (RAC). The DAC and RAC may be configured, utilizing processes further described herein, to allow synchronous signals derived from E1, T1, or Synchronous Ethernet signals to minimize wander effects as described herein. The INU may contain the modulator/demodulator, multiplexer, control, and traffic interface elements. The INU and ODU may be coupled together using a cable or any other means.

By comparison, an all-indoor radio has all radio equipment installed inside and is connected to its antenna using a waveguide or coax feeder. A split-mount radio may be a point-to-point radio installation for licensed 6 to 38+ GHz frequency bands with the ODU direct-mounted to the rear of the antenna to provide an integral antenna feed. By having the ODU mounted with the antenna, split-mount may eliminate or reduce feeder losses, minimize or reduce rack occupancy, and/or lower installed costs compared to indoor radios.

For example, transceiver unit 102 may comprise an INU 108 in communication with a processor and/or a digital device, an ODU 110 in communication with the INU 108 over cables 118, a waveguide 112 in communication with the ODU 110, and an antenna 116. The INU 108 may comprise a modulator/demodulator and control circuitry for providing data from a digital device or a processor over line 114 to the antenna 116 via the ODU 110 and/or the waveguide 112. Similarly, the INU 108 may also be configured to receive information from the antenna 116 via the ODU 110 for providing to the digital device or processor via the line 114. The ODU 110 may comprise an RF transmitter/receiver and be coupled with the antenna 116. The waveguide 112 may or may not be a part of the ODU 110.

The INU 108 of the transceiver unit 102 may be coupled to the ODU 110 utilizing a coaxial cable 118. Although only one coaxial cable 118 is depicted in FIG. 1, any number of coaxial cables may provide signals between the INU 108 and the ODU 110. Further, those skilled in the art will appreciate that any number and/or type of cables may be configured to receive and transmit signals between the INU 108 and the ODU 110.

Similarly, transceiver unit 104 may comprise an INU 120 in communication with a processor and/or a digital device, an ODU 122 in communication with the INU 120 over cable 130, a waveguide 124 in communication with the ODU 122, and an antenna 128. The INU 120 may comprise a modulator/demodulator and control circuitry for providing data from a digital device or a processor over line 126 to the antenna 128 via the ODU 122 and/or the waveguide 124. Similarly, the INU 120 may also be configured to receive information from the antenna 128 via the ODU 122 for providing to the digital device or processor via the line 126. The ODU 122 may comprise an RF transmitter/receiver and be coupled with the antenna 128. The waveguide 124 may or may not be a part of the ODU 122.

The INU 120 of the transceiver unit 104 may be coupled to the ODU 122 utilizing a coaxial cable 130. Although only one coaxial cable 130 is depicted in FIG. 1, any number of coaxial cables may provide signals between the INU 108 and the ODU 110. Further, those skilled in the art will appreciate that any number and/or type of cables may be configured to receive and transmit signals between the INU 108 and the ODU 110.

Those skilled in the art will appreciate that the transceiver unit 104 may perform in a manner similar to the transceiver unit 102. In various embodiments, the two transceiver units 102 and 104 may be in communication with each other over a wireless communication tower 106. Those skilled in the art will appreciate that the transceiver units 102 and 104, individually or together, may communicate with any digital device or receiver.

The wireless communication tower 106 (e.g., cell tower or other microwave radio device) may be any device configured to receive and/or transmit wireless information.

Figure 2:
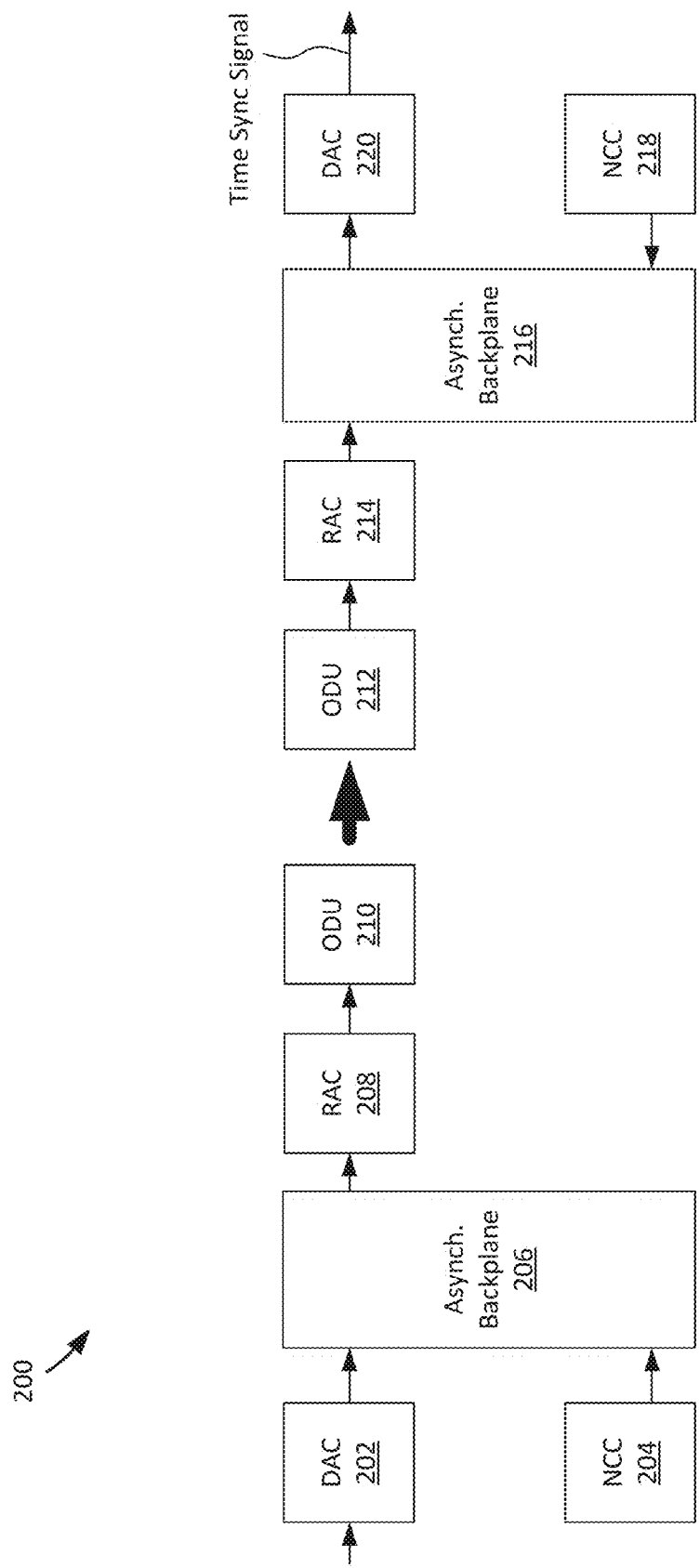
FIG. 2 is a high level diagram regarding communication between two transceiver units in some embodiments.

FIG. 2 is a high level diagram 200 regarding communication between two transceiver units in some embodiments. The diagram 200 depicts data access card (DAC) 202 and NCC (TDM clock source) 204. The DAC time multiplexs E1, T1, or Synchronous Ethernet signals from a customer interface card (e.g., customer premises equipment or CPE) onto an asynchronous (TDM) backplane 206. Timing transfer over the backplane 206 may use a byte stuffing design due to the nature of the asynchronous E1, T1, or Synchronous Ethernet clocks relative to the backplane clock. The RAC 208, containing a modulator/demodulator card, may be configured to recover the data from the asynchronous backplane 206 and respond to the stuffing opportunities on a TDM frame. Doing so may result in time gaps that are smoothed by FIFO circuits to generate and pass a synchronous clock. Unfortunately, the processing of signals from the asynchronous backplane 206 may cause wander buildup from hop to hop as the timing signal must pass through multiple radio nodes.

The resulting wander buildup due to backplane stuffing requirements may cause the system to fail G8262 synchronization requirements. G8262 is an ITU-T recommendation for synchronous Ethernet that defines "timing characteristics of synchronous Ethernet equipment slave clock (EEC)." A new version was published in 2010.

A similar effect may be found within the receiving transmitter. For example, the ODU 212 may receive a signal from the ODU 210 over a wireless link. The RAC 214 may receive a clock signal. In a manner similar to that discussed with regard to the DAC 202, the NCC 218 time multiplexes the clock signal on the asynchronous backplane 216. The DAC 220 may be configured to receive the data from the asynchronous backplane 216 in a manner similar to that discussed with regard to the RAC 208.

In various embodiments, stuffing and/or destuffing requirements may be loosened or eliminated in order to allow the modem to synchronize to a low jitter wander clock.

Figure 3:
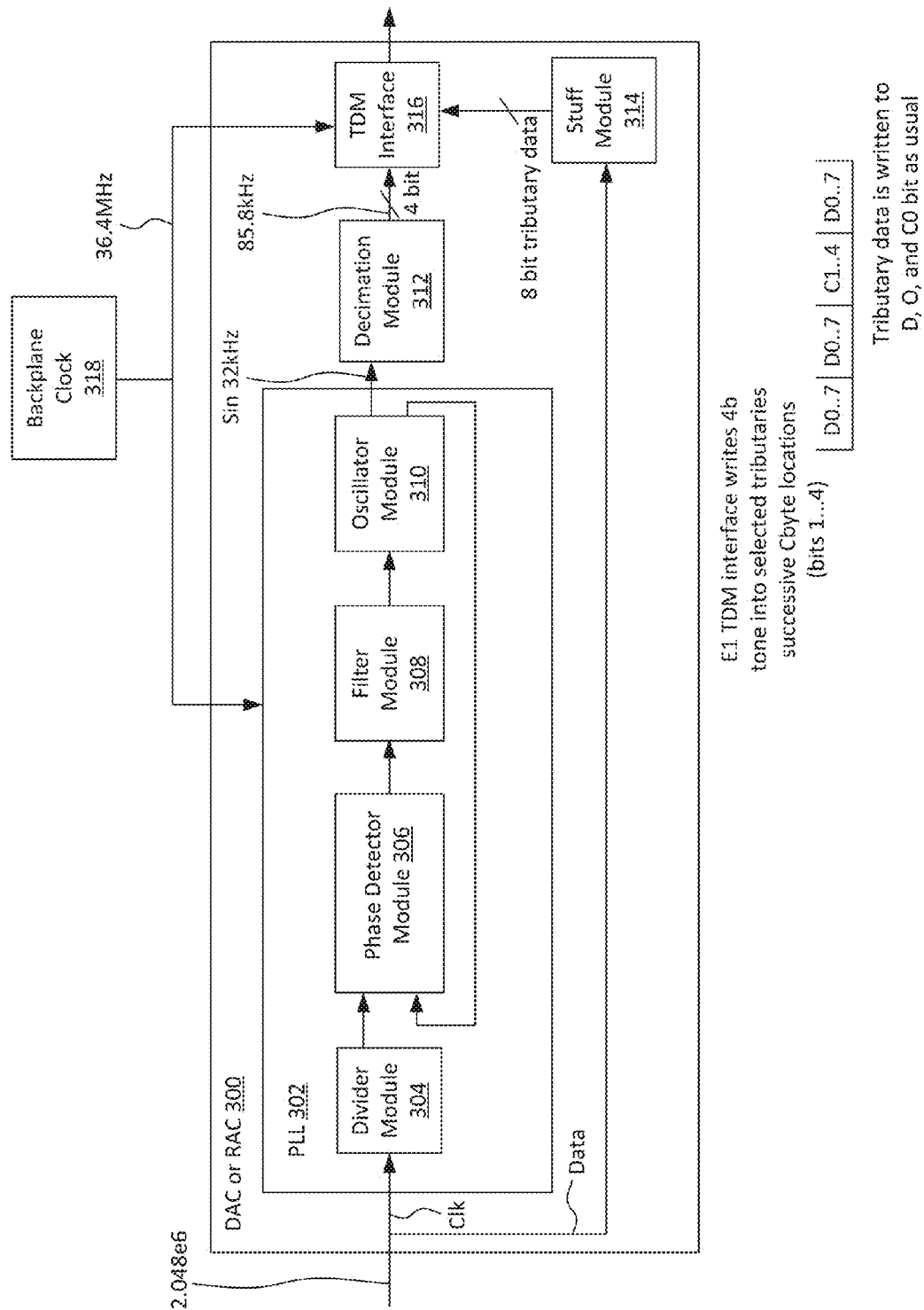
FIG. 3 is a block diagram of a transmitting DAC or RAC in some embodiments.

FIG. 3 is a block diagram of a DAC or RAC 300 in some embodiments. For the purpose of the following discussion, the block diagram of FIG. 3 will be referred to as a DAC 300. Those skilled in the art will appreciate that the block diagram of FIG. 3 may be a RAC configured to provide data and a timing signal to another RAC. Various embodiments described herein may be used to synchronize any clock signal across a link utilizing frames and/or other data packets between devices (e.g., between DAC 300 and a RAC). For purposes of this discussion, the DAC 300 may be termed a transmitting device and the RAC may be termed a receiving device.

Figure 5:
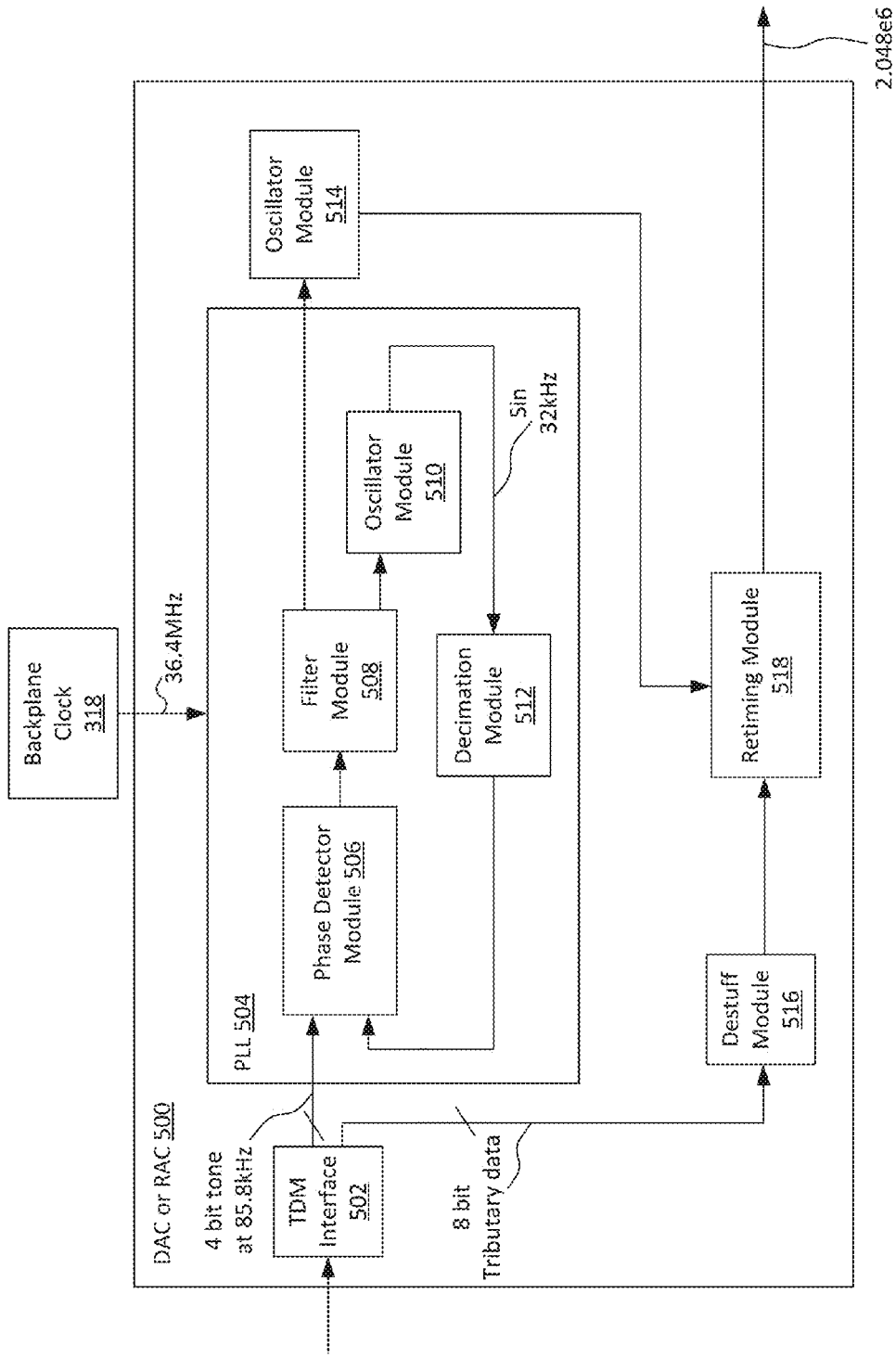
FIG. 5 is another block diagram of a receiving DAC or RAC in some embodiments.

The DAC 300 comprises a phase lock loop 302, a decimation module 312, a stuff module 314, and a TDM interface 316 configured to provide data and timing signals via the TDM interface 316 to a RAC (discussed with respect to FIG. 5).

At a high level, a DAC 300 receives customer applied E1, T1, or Synchronous Ethernet data, recovers the synchronous clock from the customer source (e.g., 2048 KHz or 1544 KHz), and synchronizes the PLL 302 to the recovered clock. The PLL module 302 comprises a divider module 304, a phase detector module 306, a filter module 308, and an oscillator module 310. The PLL 302 may be a digital PLL.

In various embodiments, the DAC 300 may receive an initial clock signal and a data signal. In one example, the initial clock signal and the data signal are received from customer equipment. The PLL module 302 may receive the initial clock signal and the stuff module 314 may receive the data. In some embodiments, a splitter or other module directs the initial clock signal to the PLL module 302 and directs the data to the stuff module 314.

The initial clock signal may be applied to the PLL module 302 via an internal divider by the divider module 304. In this example, the divider ratio of the divider module 304 is 1/64. Other divider ratios could be utilized depending upon the system requirements.

In various embodiments, in order to determine a divider ratio, a frame rate for TDM frames is determined. Here, the frame rate for TDM frames is 85.8 kHz. An initial periodic signal generated by the PLL module 302 may be at a frequency that is equal to or less than half of the frame rate (for the Nyquist rate). Here, the frequency rate for the initial periodic signal is 32 kHz. The divider module 304 may divide the initial clock signal received from the customer equipment to a frequency that is equal to the first periodic signal. Here, the initial clock signal is at 2.048 MHz which is divided by the divider module 304 to a frequency of 32 kHz.

The phase detector module 306 receives the divided clock signal from the divider module 304, receives the feedback signal (e.g., the initial periodic signal) from the oscillator module 310 (further described herein), and detects and/or adjusts the phase differences based on the two signals. The phase detector module 306 may be any kind of phase detector module. In one example, the phase detector 306 is a flip flop phase detector.

The filter module 308 may filter the signal from the phase detector module 306. The filter module 308 may comprise a loop filter, lowpass filter, and/or any kind of filter.

In various embodiments, the PLL 302 includes an oscillator module 310 (e.g., NCO) with a large enough word size to provide low jitter performance. The oscillator module 310 generates the initial periodic signal based on the filtered signal from the filter module 308. The initial periodic signal may represent a tone that will be used to regenerate and synchronize the initial clock signal in the receiving RAC. The output of the oscillator module 310 (i.e., the initial periodic signal) may be applied to the TDM frame. The output of the oscillator module 310 may also be provided to the phase detector module 306 as a feedback signal. The oscillator module 310 may comprise any number and any kind(s) of oscillator(s).

The PLL 302 is synchronized with the backplane clock 318 (shown as 36.4 MHz) which is asynchronous to the initial clock that generated the initial clock signal received by the DAC 300.

The MSBs (most significant bits) output of the oscillator module 310 are decimated by the decimation module 312. In other words, the initial periodic signal (e.g., sin 32 kHz) is oversampled. The decimation module 312 may sample the initial periodic signal at a fraction of the backplane clock 318 to provide samples to the TDM interface 316. In one example, the backplane clock 318 is 36.4 MHz that operates the decimation module 312 for the desired frame rate. In this example, the decimation module 312 samples the initial periodic signal once every 424 backplane clock cycles for a frame rate of 85.8 kHz (e.g., 36.4 MHz of the backplane clock 318 rate divided by 424 is equal to 85.8 kHz). The decimation module 312 may be any hardware, software, or combination of both configured to down-sample the first periodic signal. The decimation module 312 may sample the initial periodic signal at any rate.

The output of the oscillator module 310 may be any number of bits. In some embodiments, the output of the oscillator module 310 may be any number of bits including or between (but not limited to) three to eight (e.g., equal to the capacity of a control byte in a byte-based TDM frame). For example, plot 902 of FIG. 9 further discussed herein depicts the 32 kHz tone generated at 36.4 MHz at high precision. Plot 904 depicts the 32 kHz tone generated at 36.4 MHz at 4 b precision.

The number of bits of the output of the oscillator module 310 may be based on the unused capacity of a frame (e.g., TDM frame). TDM frames are further discussed herein.

The stuff module 314 may receive data that was provided with the initial clock signal. The stuff module 314 transfers data asynchronously to the TDM interface 316 without regard to the aforementioned periodic control signal using regular stuff control bits and opportunity bytes.

The TDM interface 316 operates on frames (e.g., TDM frames generated by a Node Control Card) utilizing 8 bit tributary data from the stuff module 314 and the samples of the first periodic signal. In various embodiments, the TDM interface 316 injects up to one 7 bit word per frame (e.g., 4 bit initial periodic signal sample) into the unused bits of one stuffing control byte of a TDM frame. For example, plot 906 of FIG. 9, discussed further herein, shows the 85.4 kHz sample points (2-3 samples per sinusoid). Plot 908 depicts sample values to be conveyed in the TDM bus. Although not appearing sinusoidal, the plot indicates that less bits per sample are likely sufficient (e.g., 1 or 2 bits).

Although the TDM interface 316 is identified as being TDM, those skilled in the art will appreciate that any interface configured to generate and/or process frames may be used. The data and the bit samples of the initial periodic signal may be included in the frames. In some embodiments, the initial clock signal may be recovered between any two devices such as, but not limited to, two RACs, two DACs, a RAC and a DAC, or any transmitter and receiver. In one example, various systems and methods described herein may be used to recover an initial clock signal across a wired link or air link (e.g., any wired or wireless network).

Figure 4:
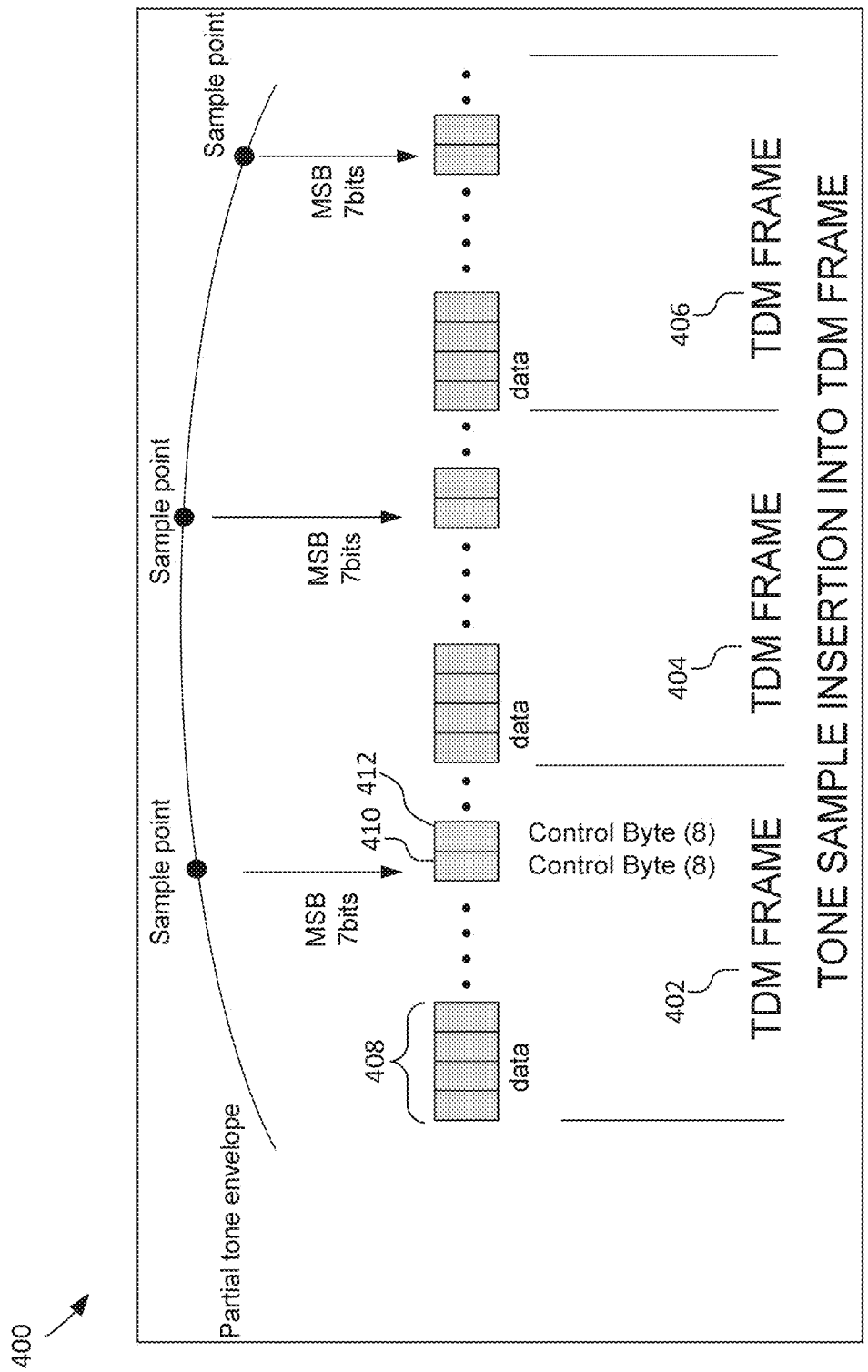
FIG. 4 is a tone sample insertion diagram in some embodiments.

FIG. 4 is a tone sample insertion diagram 500 in some embodiments. In various embodiments, the TDM interface 316 applies each sample point word TDM frame by TDM frame. Samples of the 32 kHz tone (i.e., samples of the initial periodic signal), locked to the initial clock signal, are passed onto the TDM backplane to be recovered by the RAC circuit (discussed further herein). Bits from the sampled initial periodic signal may be stored in the first control byte 410 of the TDM frame 402. Similarly, bits from the sampled initial periodic signal may be stored in the control bytes of the TDM frame 404 and/or 406.

In various embodiments, bits within control bytes 410 (as well as the control bytes of other TDM frames) may be unused. As a result, the storage of bits representative of samples of the initial periodic signal may be stored within TDM frames without impacting data flow.

The second control byte 412 may be used to carry data. In one example, the first bit of the control byte 410 may indicate whether the control byte 412 contains data. Data (e.g., from the stuff module 314) may be carried by the data bytes 408 in TDM frame 402 as well as the other data bytes of the other TDM frames.

In some embodiments, the first and/or second control bytes 410 and 412 may store data and/or bits of the samples of the initial periodic signal. For example, the first control byte 410 may contain bits related to the sampled initial periodic signal while the second control byte 412 and/or the data bytes may contain data from the stuff module 314. The rest of the first control byte 410 may contain bits from the samples of the initial periodic signal. If the second control byte 412 does not carry any data or is only partially full, the second control byte 412 may carry bits related to the sampled initial periodic signal.

Although three TDM frames are depicted in FIG. 4, those skilled in the art will appreciate that there may be any number of TDM frames. Further, each TDM frame may comprise data representative of a sample point of the first periodic signal. For example, 7 bits (most significant bits or MSB) of the sampled first periodic signal may be stored in the first control byte of each TDM frame. In some embodiments, not all TDM frames include bits of the sampled first periodic signal (e.g., every second TDM frame could be used to convey the periodic signal).

Further, there may be any number of bits related to the sampled initial periodic signal. In one example, any number of bits (related to the sampled initial periodic signal) that fit within the first control byte may be used FIG. 5 is another block diagram of a receiving DAC or RAC 500 in some embodiments. In various embodiments, a method and system is described herein for transferring a high quality timing reference between modules (e.g., an RAC and a DAC within an INU chassis). In one example, the method includes sending a 4-bit tone between two digital phase locked loops (DPLLs) which allows them to stay tightly synchronized together. The tone may be conveyed across a TDM bus. In one example, the tone is conveyed within justification control time slots to utilize otherwise unused backplane capacity.

In the RAC 500, recovered initial periodic signal samples (e.g., tone samples) are used to re-construct the initial periodic signal with a PLL 504 and synchronize the TDM clock which may be used to generate a symbol clock for the TX modulator. In various embodiments, the symbol clock is ultimately locked to the original timing signal without having timing gaps that are a result of stuffing and de-stuffing across the back plane.

As discussed herein, for the purpose of the following discussion, the block diagram of FIG. 5 will be referred to as a RAC 500. Those skilled in the art will appreciate that the block diagram of FIG. 5 may be a RAC configured to received data and a timing signal from another RAC. Further, The DAC or RAC 500 may be a DAC or any other receiving device. The RAC 500 comprises a TDM interface 502, a phase lock loop 504, an oscillator module 514, a destuff module 516, and a retiming module 518.

At a high level, the RAC 500 receives the frames from the transmitting DAC or RAC. The RAC 500 may lock a recreated tone or periodic signal utilizing the samples of the initial periodic signal. The RAC 500 may generate a recreated clock signal synchronized to the recreated tone or periodic signal. As a result, the recreated clock signal may be synchronized to the initial clock signal. The recreated clock signal and/or data from the DAC or RAC 300 may be provided to one or more other devices and/or units (e.g., an ODU for microwave transmission over a wireless link).

In various embodiments, the TDM interface 502 receives frames from the DAC or RAC 300. Data (e.g., 8 bit tributary data) may be provided to the destuff module 516 and the 4 bit tone samples of the initial periodic signal at 85.8 kHz may be provided to the PLL 504. Although the TDM interface 502 is identified as "TDM," those skilled in the art will appreciate that the interface may be any kind of interface configured to receive and/or process any periodic frames or groups of data.

The PLL module 504 comprises a phase detector module 506, a filter module 508, an oscillator module 510, and a decimation module 512. The PLL 504 may be a digital PLL.

The phase detector module 506 receives the samples of the initial periodic signal and a decimated recreated periodic signal discussed further herein. The phase detector module 506 detects and/or adjusts the phase differences based on the two signals. The phase detector module 506 and/or the filter module 508 may lock the recreated periodic signal to the initial periodic signal. The phase detector module 506 may be any kind of phase detector module. In one example, the phase detector is a multiply phase detector.

The filter module 508 may filter the signal from the phase detector module 506. The filter module 508 may comprise a loop filter, bandpass filter, and/or any kind of filter.

In various embodiments, the PLL 504 includes an oscillator module 510 (e.g., NCO) which recreates the initial periodic signal based on the filtered signal from the filter module 508. The recreated periodic signal may represent a tone that will be used to regenerate and synchronize the recreated clock signal. The output of the oscillator module 510 (i.e., the recreated periodic signal) may be sampled by the decimation module 512

The PLL 504 may be synchronized with the backplane clock 318 (shown as 36.4 MHz) which is asynchronous to the initial clock that generated the initial clock signal received by the DAC 300. In some embodiments, the PLL 504 and the PLL 302 using the same backplane clock 318. In various embodiments, the PLL 504 and the PLL 302 utilize different clocks.

In various embodiments, the recreated periodic signal from the oscillator module 510 is decimated by the decimation module 512. In one example, the backplane clock 318 is 36.4 MHz that operates the decimation module 512 for the desired frame rate. In this example, the decimation module 512 samples the recreated periodic signal once every 424 backplane clock cycles for a frame rate of 85.8 kHz (e.g., 36.4 MHz of the backplane clock 318 rate divided by 424 is equal to 85.8 kHz). The decimation module 510 may be any hardware, software, or combination of both configured to down-sample the recreated periodic signal. The decimation module 510 may sample the recreated periodic signal at any rate.

In a manner similar to the decimation module 312, the decimation module 510 may sample the recreated periodic signal at a fraction of the backplane clock 318 to provide the decimated recreated periodic signal to the phase detector module 506. The phase detector module 506 may lock the phase of the recreated periodic signal with the phase of the sampled initial periodic signal to synchronize the recreated clock signal of the oscillator module 514 discussed herein.

In some embodiments, the initial periodic signal generated by the PLL module 302 may be at a frequency that is greater than half of the frame rate. The initial periodic signal, however, may be perceived by the PLL 504 at a lower frequency as a result of aliasing. In one example, if the frequency of the initial periodic signal is ¾ of the TDM frame rate, the PLL module 302 may lock the decimated recreated periodic signal to ¼ of the TDM frame rate. Those skilled in the art will appreciate that the initial periodic signal may be at any frequency.

The oscillator module 514 may be an NCO configured to recreate the initial clock signal. The recreated clock signal of the oscillator module 514 may be synchronized to the initial clock signal based on the locked tone signal (e.g., the locked periodic signal) of the PLL 504. In one example, the oscillator 514 generates a recreated clock signal at 2.048 MHz. The oscillator module 514 may comprise any number or type of oscillator.

Although FIG. 5 depicts the filter module coupled to the oscillator module 514, any modules, interfaces, and clocks in FIGS. 3 and 5 may be in any order. In one example, the filter module 508 is coupled to the oscillator module 510 which is, in turn, coupled to the oscillator module 514.

The destuff module 314 may receive the frames from the TDM interface 502 and retrieve data. The retiming module 518 may receive data from the destuff module 516 and the recreated clock signal. The retiming module 518 may provide the data and/or recreated clock signal (e.g., to the ODU and/or antenna). In some embodiments, the retiming module 518 comprises a FIFO.

Figure 6:
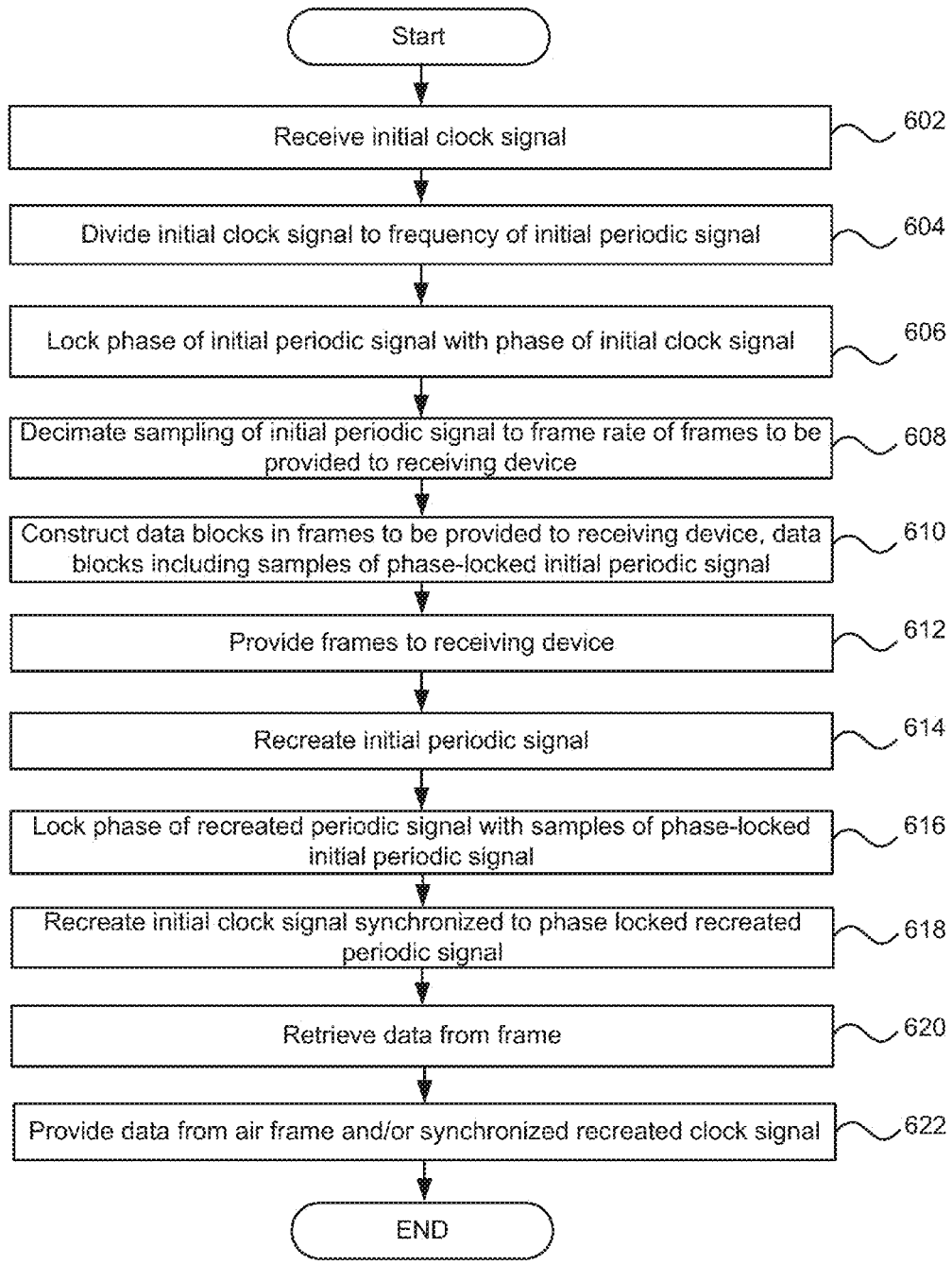
FIG. 6 is a flow diagram for synchronizing a recreated clock signal based on a tone signal in some embodiments.

FIG. 6 is a flow diagram for synchronizing a recreated clock signal based on a tone signal in some embodiments. In step 602, a RAC or DAC 300 receives an initial clock signal. In one example, the initial clock signal is 2.048 MHz. The initial clock signal may be received from customer equipment (e.g., CPE) or any other source. The initial clock signal may be any signal at any frequency.

In step 604, the divider module 304 divides the initial clock signal to a frequency of an initial periodic signal. In some embodiments, a periodic signal frequency may be chosen that is equal to or less than half of a frame rate for transmission. In one example, the frame rate is 85.8 kHz and the initial periodic signal (e.g., initial tone) is determined to be a sine wave of 32 kHz. As a result, the divider ratio of the divider module 304 may be determined to be 1/64 (i.e., 2.048 MHz/64=32 kHz). The divider module 304 may divide the initial clock signal frequency for phase detection and adjustment with the initial periodic signal by the PLL 302.

In step 606, the PLL 302 locks the phase of the initial periodic signal with the phase of the divided initial clock signal. The PLL 302 may filter the signal and provide the filtered comparison to the oscillator module 310 to recreate and lock the initial periodic signal. The oscillator module 310 may provide the initial periodic signal to the phase detector module 306 as a feedback loop.

In step 608, a decimation module 312 decimates sampling (e.g., down-samples) the phase-locked initial periodic signal to the frame rate of frames to be provided to the receiving device (e.g., DAC or RAC 500). In one example, the decimation module 312 operates at the clock rate provided by the backplane clock 318. The decimation module 312 may down-sample the phase-locked initial periodic signal to provide samples to individual frames to be provided. For example, the decimation module 312 may down sample the initial periodic signal at 1 of every 424 cycles of the backplane clock 318 (e.g., 36.4 MHz/424=85.8 kHz).

In step 610, the TDM interface 316 may generate data blocks in frames to be provided to the receiving RAC or DAC 500. One or more data blocks may include samples of the phase-locked initial periodic signal. In one example, the TDM interface 316 may provide bits representing a sample of the phase-locked initial periodic signal. The bits may be MSB of the phase-locked initial periodic signal. In one example, the frame has a byte (e.g., control byte 410) that may be used to provide bits representing a sample of the phase-locked initial periodic signal. In this example, there may be up to eight bits representing the representing the sample of the phase-locked initial periodic signal. Those skilled in the art will appreciate that there may be any number of bits and/or any number of bytes of the frame that may be used to provide bits representing the sample of the phase-locked initial periodic signal.

In some embodiments, the frame may also include data from the customer equipment. The data may be stuffed or placed within data bytes of the frame and/or opportunity bytes such as an additional control byte 412. In some embodiments, there may be bits reserved for the first control byte 410 which indicates whether a second control byte 412 is used for data. In this example, the first control byte 410 may be limited to storing one to seven bits representing a sample of the phase-locked initial periodic signal.

Those skilled in the art will appreciate that there may be any kind of frame, packet, or other grouping of data blocks that may be provided by the DAC or RAC 300 to the DAC or RAC 500. In step 612, the TDM interface 316 provides the frames to the RAC or DAC 500.

In step 614, the RAC or DAC 500 recreates the initial periodic signal. In one example, the TDM interface 502 of the RAC or DAC 500 retrieves the samples of the bits representing the sample of the phase-locked initial periodic signal from the frames. The PLL 504 recreates the initial periodic signal with the oscillator module 510 and locks the recreated periodic signal with the initial periodic signal in step 616.

In some embodiments, the recreated periodic signal is down-sampled by decimation module 512 to allow for phase locking by the PLL 504. For example, the decimation module 512 may operate at the backplane clock 318. The decimation module 512 may provide samples of the recreated periodic clock at the frame rate for phase detection. In one example, the decimation module 512, like the decimation module 312, may down sample the recreated periodic signal at 1 of every 424 cycles of the backplane clock 318 (e.g., 36.4 MHz/424=85.8 kHz).

Those skilled in the art will appreciate that the PLL 504 may, in some embodiments, operate at a different clock than the DAC or RAC 300. In one example, the backplane clock 318 of the DAC or RAC 300 may not be synchronized with a backplane clock of the DAC or RAC 500. The PLL 504 and the NCO 510 may be required to generate a clean clock at the same frequency as the periodic signal from the TDM interface.

In step 616, the PLL 504 locks the phase of the recreated periodic signal with the phase-locked initial periodic signal. For example, the PLL 504 may lock the phases of the samples of the initial periodic signal from the TDM interface 502 with the samples of the recreated periodic signal from the decimation module 512.

In step 618, the oscillator module 514 may recreate the initial clock signal synchronized to the phase-locked recreated periodic signal. As a result, the recreated signal may be locked to the initial clock signal. In one example, the oscillator module 514 generates a signal at the same frequency (e.g., 2.048 MHz) as the initial clock signal. The generated signal (i.e., the recreated initial clock signal) is based on the phase-locked recreated tone and, as a result, may be synchronized with the initial clock signal.

In step 620, the destuff module 516 retrieves data from the frames provided by the DAC or RAC 300 via the TDM interface 502. The destuff module 516 may retrieve the data from one or more data bytes of any number of frames.

In step 622, the retiming module 518 may receive the data from the destuff module 516, receive the recreated clock signal from the oscillator module 514, and provide the data and/or recreated clock signal to another device or unit. In one example, the data and/or recreated clock signal is provided to the ODU or customer equipment.

Figure 7:
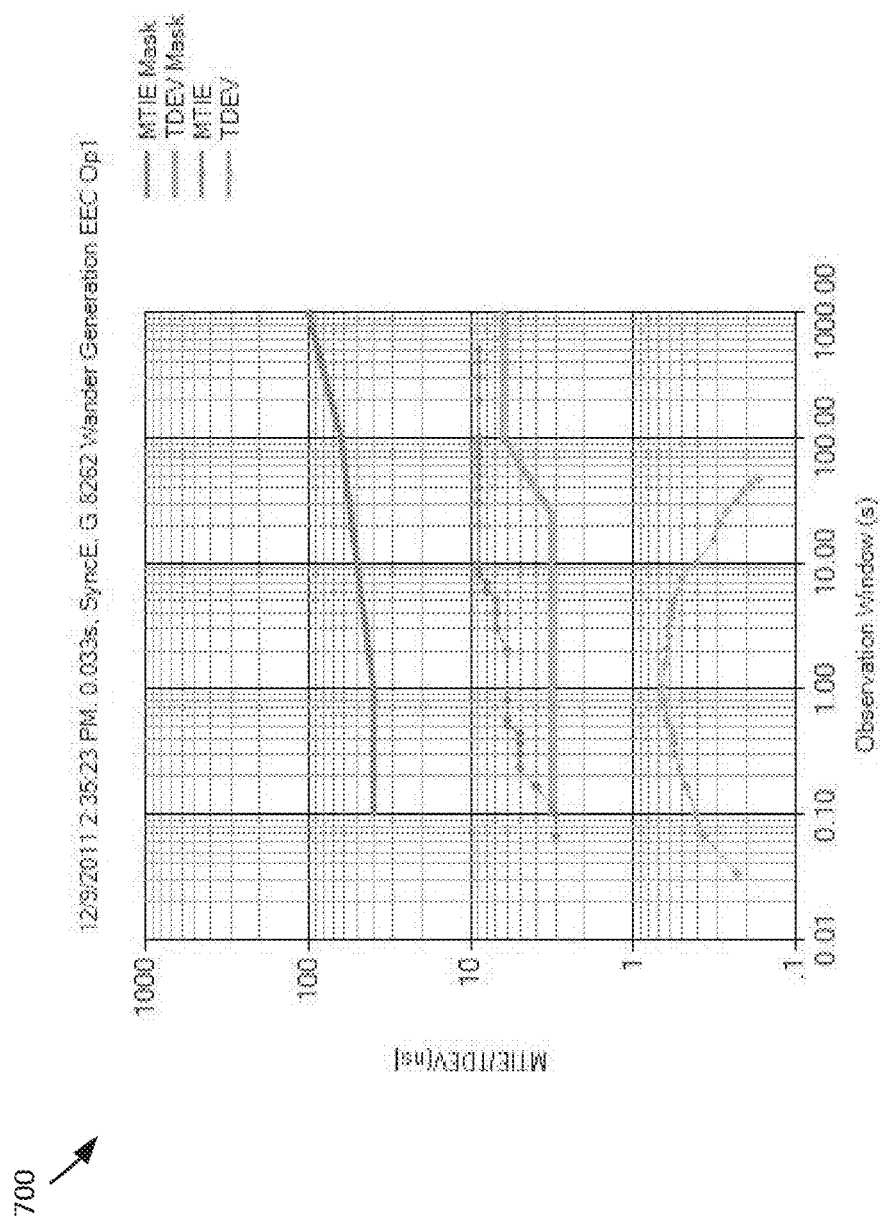
FIG. 7 is a graph of a test utilizing an E1 backplane in some embodiments described herein.

FIG. 7 is a graph 700 of a test utilizing an E1 backplane in some embodiments described herein. Graph 700 depicts wander measurement between two modules (e.g., DAC and RAC) utilizing the tone conveyed across the TDM bus to synchronize the DPLLs in the respective module. The graph 700 measure observations along the x axis and MTIE (maximum time interval error)/TDEV (Time Deviation). The measurements in graph 700 show limited wander.

Figure 8:
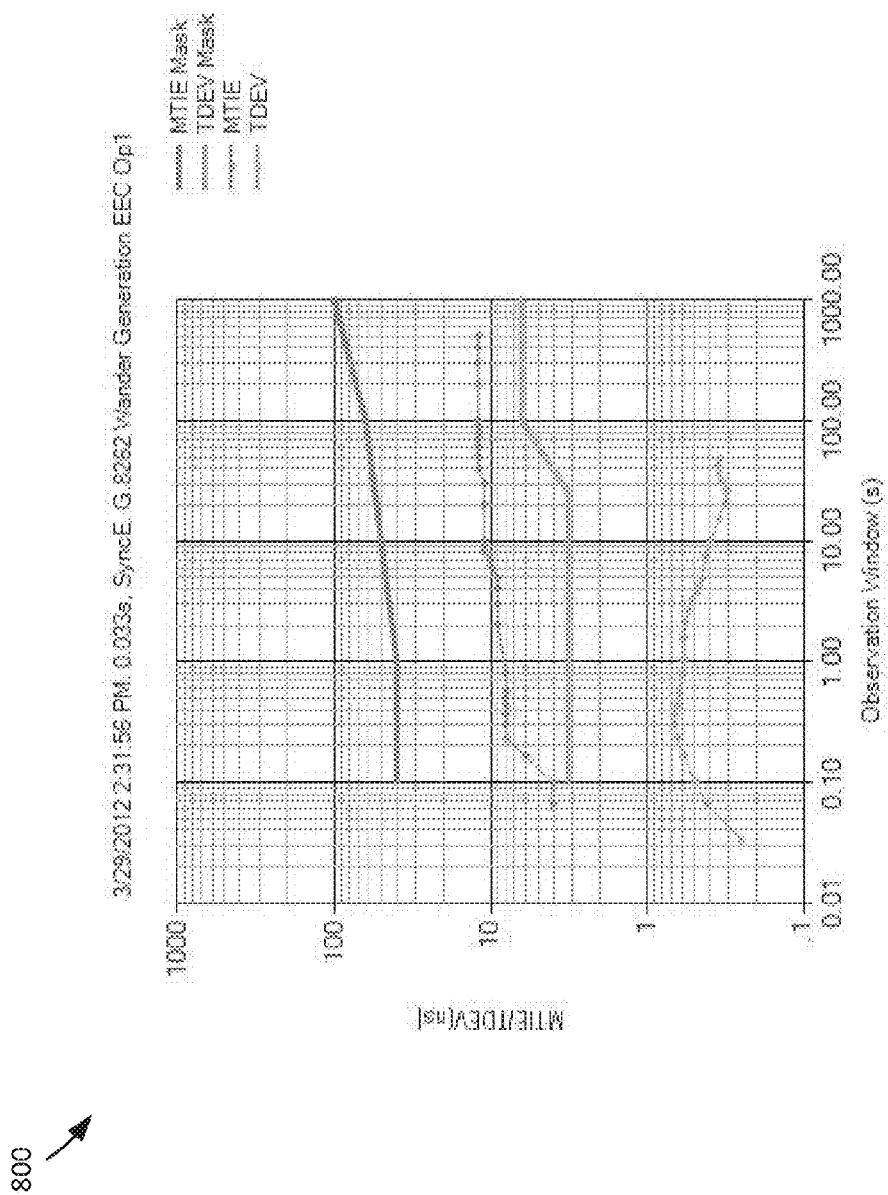
FIG. 8 is a graph of a test utilizing a DS1 backplane in some embodiments described herein.

FIG. 8 is a graph 800 of a test utilizing a DS1 backplane in some embodiments described herein. The measurements depicted in Graph 800 are based on the same test hardware used with regard to FIG. 8. Like graph 700, graph 800 depicts wander measurement between two modules (e.g., DAC and RAC) utilizing the tone conveyed across the TDM bus to synchronize the DPLLs in the respective module. The measurements in graph 800 show limited wander.

Figure 9:
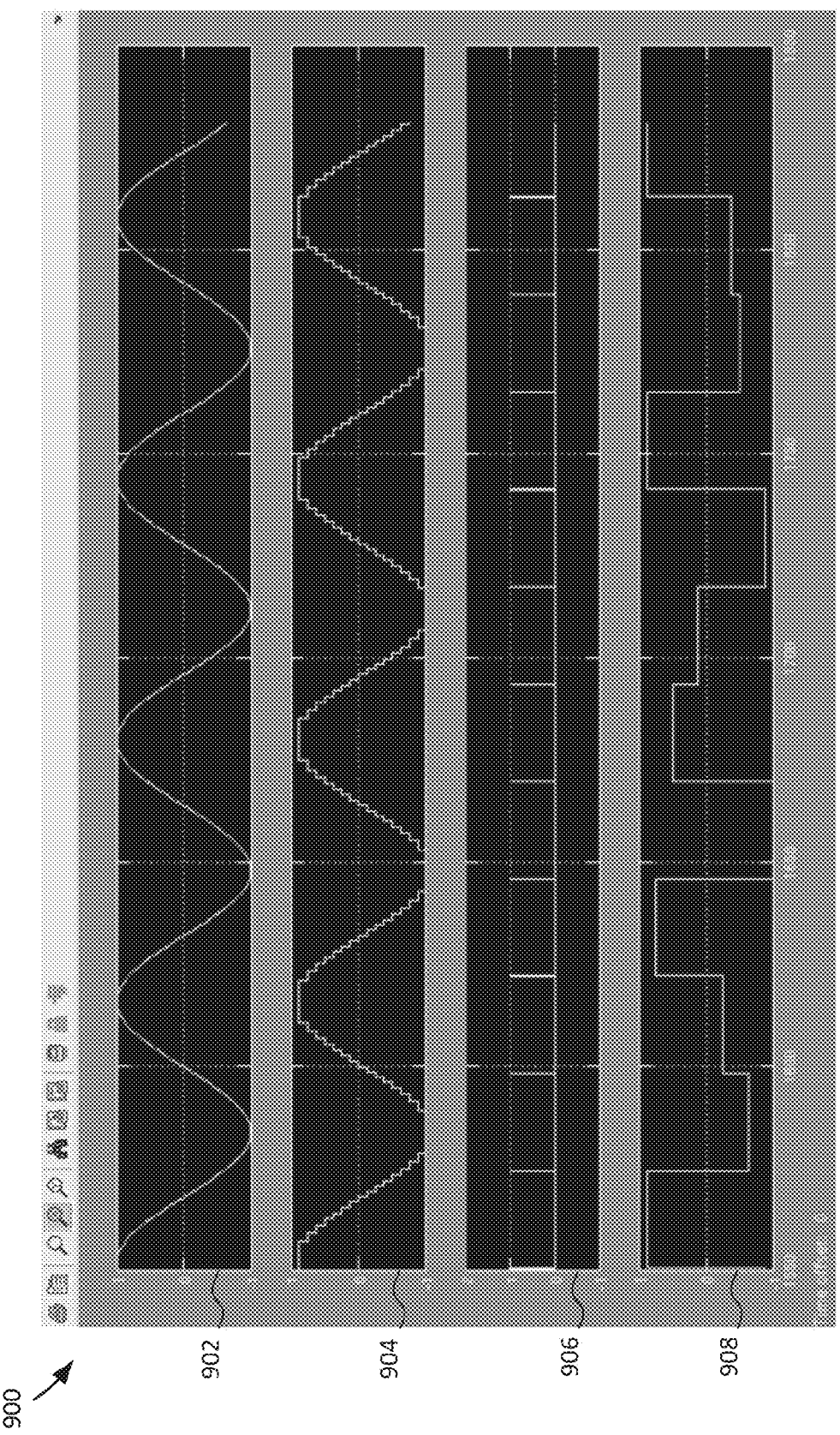
FIG. 9 is a graph of scope measurements in some embodiments described herein.

FIG. 9 is a graph 900 of scope measurements in some embodiments described herein. Plot 902 of graph 900 depicts the 32 kHz tone generated at 36.4 MHz at high precision. Plot 904 depicts the 32 kHz tone generated at 36.4 MHz at 4 b precision. Plot 906 shows the 85.4 kHz sample points (2-3 samples per sinusoid). Plot 908 shows the sample values to be conveyed in the TDM bus. Although plot 908 does not appear to be sinusoidal, a spectrum plot shows the 32 kHz present which may indicate that even less bits per sample may likely sufficient (e.g., the 32 kHz tone generated at 36.4 MHz may be at 3 b precision).

The above-described functions may be performed in hardware. In one example, the functions may be performed by one or more field-programmable gate arrays (FPGAs), discrete hardware, and/or one or more application-specific integrated circuits (ASICs).

Further, one or more functions may be stored on a storage medium such as a computer readable medium. The instructions can be retrieved and executed by a processor. Some examples of instructions are software, program code, and firmware. Some examples of storage medium are memory devices, tape, disks, integrated circuits, and servers. The instructions are operational when executed by the processor to direct the processor to operate in accord with some embodiments. Those skilled in the art are familiar with instructions, processor(s), and storage medium.

Various embodiments are described herein as examples. It will be apparent to those skilled in the art that various modifications may be made and other embodiments can be used without departing from the broader scope of the present invention. Therefore, these and other variations upon the exemplary embodiments are intended to be covered by the present invention(s).

The invention claimed is:

1. A system for clock signaling, the system comprising:
a transmitting device including:
    one or more terminals configured to receive a data signal and a first clock signal;
    a first phase lock loop configured to lock a phase of an initial periodic signal with a phase of the first clock signal, the first phase lock loop including a divider to generate the initial periodic signal based on the first clock signal;
    decimation circuitry configured to sample the initial periodic signal at a decimated rate of a backplane clock, the backplane clock being asynchronous with a clock that generated the first clock signal; and
    a transmitting data block interface configured to construct data blocks and provide the data blocks to a receiving device, each of one or more of the data blocks including a portion of the data signal and at least one sample of the initial periodic signal.

2. The system of claim 1, wherein the transmitting data block interface is further configured to construct the data blocks to include data from the one or more terminals.

3. The system of claim 2, wherein the receiving device includes:
    a receiving data block interface configured to receive the data blocks;
    a second phase lock loop configured to lock a phase of the at least one sample of the initial periodic signal with a phase of a second clock signal to produce a phase locked signal; and
    a clock signal generator configured to recreate the first clock signal as a recreated clock signal based at least in part on the phase locked signal.

4. The system of claim 3, wherein the receiving device includes timing circuitry coupled to the clock signal generator, the timing circuitry being configured to provide the recreated clock signal to one or more of an Outdoor Unit ("ODU") and customer equipment coupled to the receiving device.

5. The system of claim 3, wherein the receiving data block interface operates based on a first backplane data clock.

6. The system of claim 5, wherein the receiving data block interface operates based on a second clock signal that is not the first clock signal.

7. The system of claim 3, wherein the second phase lock loop further comprises second decimation circuitry configured to generate a subset of samples of the recreated clock signal to provide feedback and assist in locking a phase of the recreated clock signal with the phase of the at least one sample of the initial periodic signal.

8. The system of claim 1, wherein the transmitting data block interface comprises a Time Division Multiplexing ("TDM") interface.

9. The system of claim 8, wherein the data blocks comprise a plurality of TDM frames.

10. The system of claim 9, wherein the transmitting data block interface incorporates a plurality of bits based on the at least one sample of the initial periodic signal in each TDM frame.

11. A method comprising:
receiving a data signal;
receiving a first clock signal;
generating an initial periodic signal based on the first clock signal;
locking a phase of the initial periodic signal with a phase of the first clock signal;
sampling the initial periodic signal at a decimated rate of a backplane clock, the backplane clock being asynchronous with a clock that generated the first clock signal;
constructing data blocks, each of one or more of the data blocks including a portion of the data signal and at least one sample of the initial periodic signal; and
providing the data blocks to a receiving device.

12. The method of claim 11, further comprising constructing the data blocks to include data from one or more terminals.

13. The method of claim 11, further comprising:
receiving the data blocks;
locking a phase of the at least one sample of the initial periodic signal with a phase of a second clock signal to produce a phase locked signal; and
recreating the first clock signal as a recreated clock signal based at least in part on the phase locked signal.

14. The method of claim 13, further comprising providing the recreated clock signal to one or more of an Outdoor Unit ("ODU") and customer equipment coupled to the receiving device.

15. The method of claim 13, wherein constructing the data blocks comprises Time Division Multiplexing ("TDM") the data blocks.

16. The method of claim 15, wherein the data blocks comprise a plurality of TDM frames.

17. The method of claim 16, wherein constructing the data blocks comprises incorporating a plurality of bits based on the at least one sample of the initial periodic signal in each TDM frame.

18. A system comprising:
means for receiving a data signal and for receiving a first clock signal;
means for generating an initial periodic signal based on the first clock signal and for locking a phase of the initial periodic signal with a phase of the first clock signal;
means for sampling the initial periodic signal at a decimated rate of a backplane clock, the backplane clock being asynchronous with a clock that generated the first clock signal; and
means for constructing data blocks, each of one or more of the data blocks including a portion of the data signal and at least one sample of the initial periodic signal, and for providing the data blocks to a receiving device.

19. The system of claim 18 wherein the means for constructing the data blocks is further configured to construct the data blocks to include data from one or more terminals.

20. The system of claim 18, wherein the means for constructing the data blocks comprises a Time Division Multiplexing ("TDM") interface.

* * * * *